United States Patent [19]
Temple

[11] Patent Number: 5,473,204
[45] Date of Patent: Dec. 5, 1995

[54] TIME DELAY SWITCH

[76] Inventor: Thomas D. Temple, 112 Running Fox Rd., Columbia, S.C. 29223

[21] Appl. No.: 261,337

[22] Filed: Jun. 16, 1994

[51] Int. Cl.[6] .................................................. H01H 43/00
[52] U.S. Cl. ............................................ 307/141; 361/195
[58] Field of Search .................................... 307/141, 139; 361/195; 315/360; 200/27 B, 33

[56] References Cited

U.S. PATENT DOCUMENTS

| | | | |
|---|---|---|---|
| 3,819,885 | 6/1974 | Moroto et al. | 200/35 |
| 4,101,811 | 7/1978 | Dandrel et al. | 315/360 |
| 4,164,635 | 8/1979 | Finch et al. | 200/33 |
| 4,339,696 | 7/1982 | Jabor | 315/360 |
| 4,382,192 | 5/1983 | Mendelson | 315/360 |
| 4,389,599 | 6/1983 | Jabor | 315/360 |
| 4,494,012 | 1/1985 | Coker | 307/132 E |
| 4,500,795 | 2/1985 | Hochstein et al. | 307/141 |
| 5,051,607 | 9/1991 | Dalton | 315/360 |
| 5,258,656 | 11/1993 | Pawlick | 307/141 |

Primary Examiner—William M. Shoop, Jr.
Assistant Examiner—Albert Paladini
Attorney, Agent, or Firm—Michael A. Mann

[57] ABSTRACT

A time delay switch for use with an electrical load and a source of electrical power, including a multiple-position toggle switch and a user-programmable microchip. The toggle is movable among three positions: an "OFF" position, an "ON" position on one side of the OFF position, and a "TIMER" position on the other side of the OFF position. The toggle is biased from TIMER to OFF so that, whenever it is moved to TIMER, it returns to the central OFF position. When the toggle is moved to TIMER, an electrical signal is sent to the microchip that (1) starts a clock for a preselected period of time and (2) permits electricity to flow through the switch as though the toggle was in the ON position during that time. Alteratively, the microchip can be programmed to start passing current after the preselected period elapses. Thus, the device can be used to turn a light or other electrical load off after a user-determined period of time, or to turn the load on after a preselected time. The duration of the clock interval can be adjusted by means of dip switches or the like, and the duration of the time delay can be adjusted simply by toggling to the TIMER position to program the microchip for as many clock intervals as are desired. A transducer generates an audible or visible signal, or both, in response to movement of the switch to the TIMER position.

20 Claims, 2 Drawing Sheets

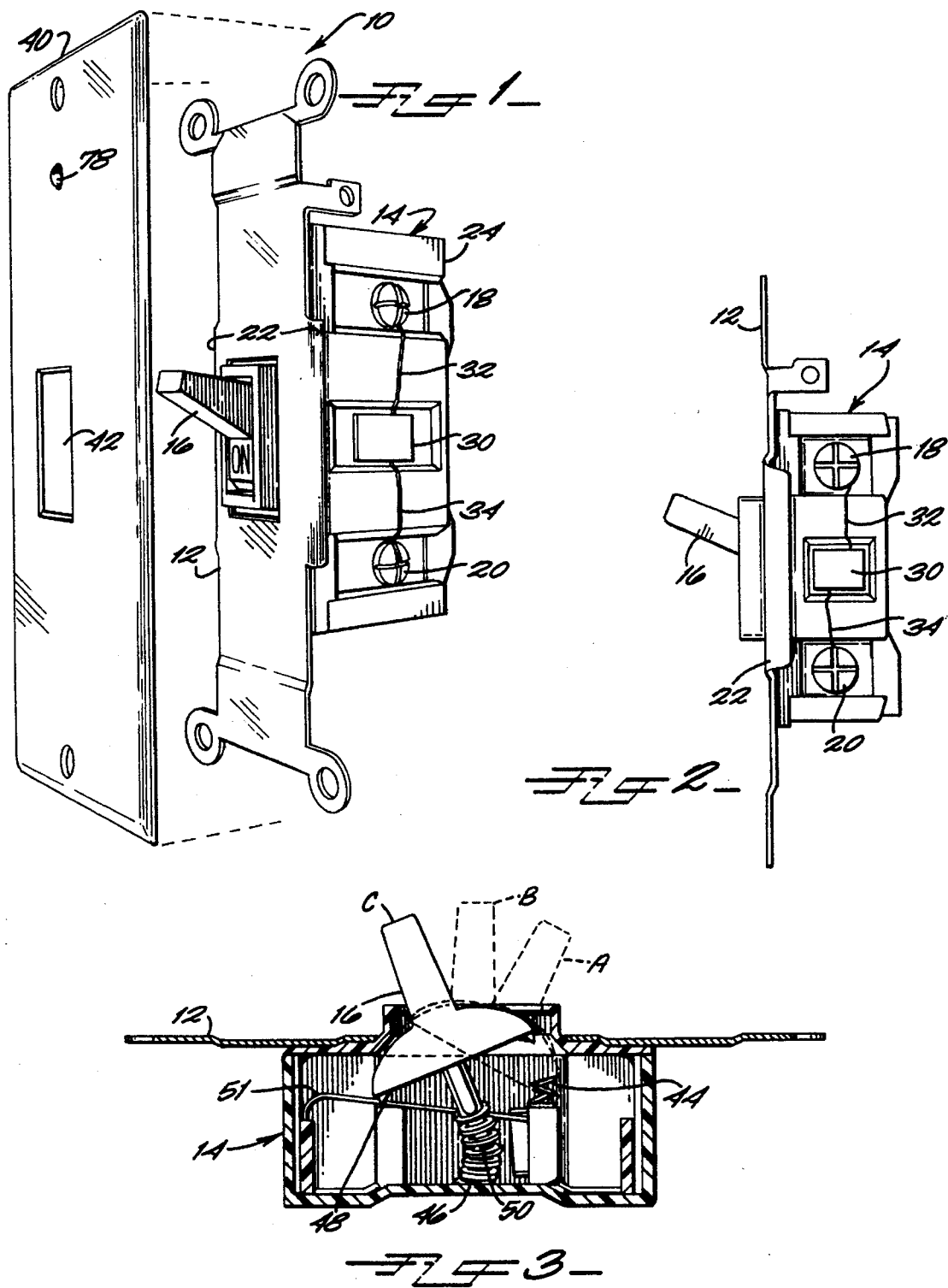

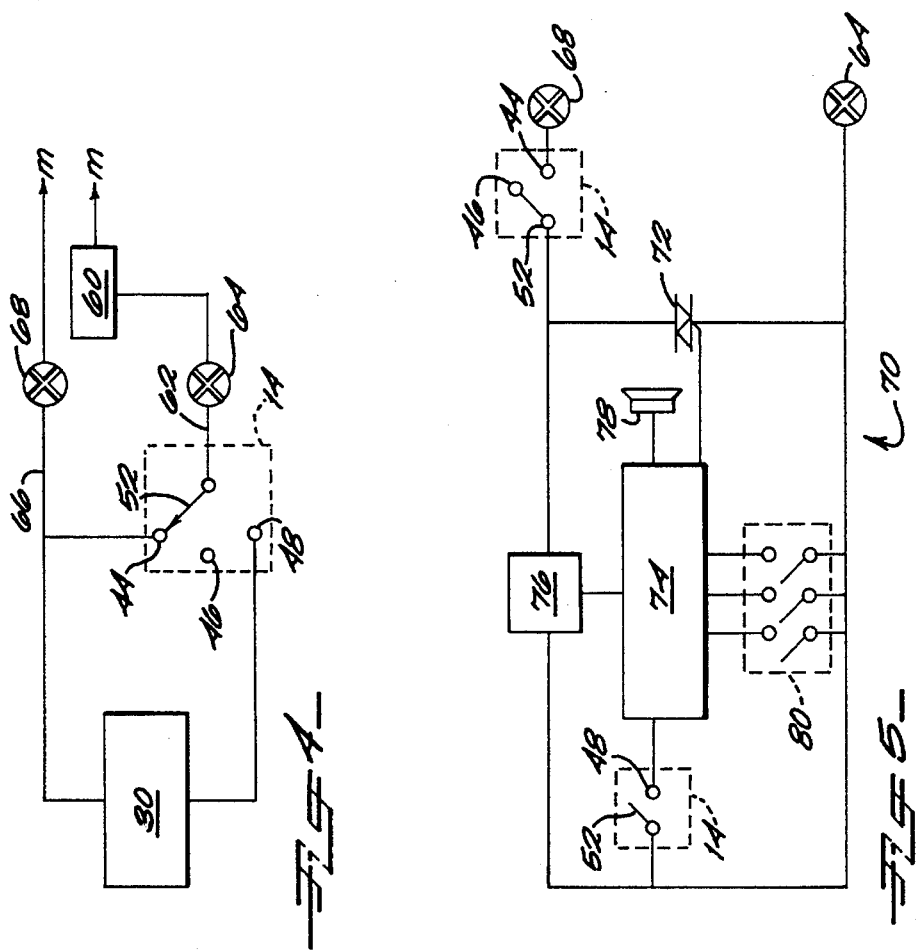

TIME DELAY SWITCH

BACKGROUND OF THE INVENTION

1. Field of the Invention

The present invention relates to a time delay switch. In particular, the present invention relates to switches that turn on or turn off the power to an electrical load at preselected, adjustable intervals of time after the switch is thrown.

2. Discussion of Background

Time delay circuits are frequently used to turn lights and other electrically-powered devices on or off, for example, to ensure that garage lights or bathroom lights are turned on while the operator is leaving the area, and automatically shut down after a preselected interval of time or at a subsequent, specific time. Time delays may also be convenient when using other appliances such as fans, air conditioners, humidifiers, electric space heaters, etc. A time delay circuit can be built into an appliance or wall outlet, or connected in the circuit through which electrical power is supplied to the appliance.

Many types of time delay circuitry are available, all providing for automatic control of a circuit so that lights or other electrical loads are turned on or off after a preselected time interval. By way of example, Dalton (U.S. Pat. No. 5,501,607) uses a single pole switch that is toggled "on" for a moment before being toggled "off." The short "on" period signals that automatic delay is desired and power flows through the circuit load for a preselected time limit. Hochstein, et al. (U.S. Pat. No. 4,500,795) automatically shut off a circuit using digital logic. Their device alerts the user to the fact that the delay period is almost over by briefly turning off a light (or other load) just before it is permanently turned off. The device includes a momentary push-button type switch and a set-reset circuit that resets the delay each time the switch is pressed. Coker (U.S. Pat. No. 4,494,012) discloses an automatic delay circuit with a three-position switch: ON, OFF, and TIMER. The time delay switches described by Jabor (U.S. Pat. Nos. 4,389,599 and 4,339,696) delay the turning off of a light after the switch has been moved to the "off" position. Both designs enable varying the duration of the delay interval by changing the resistance of a variable resistor.

Several devices simply delay the turning off of electrical power after the on/off switch is moved to the "off" position. These include Mendelson (U.S. Pat. No. 4,382,192); Dandrel, et al. (U.S. Pat. No. 4,101,811), a circuit that receives less power at some point during the delay interval; and Moroto, et al. (U.S. Pat. No. 3,819,885), a mechanical clock to determine the length of the delay.

Despite the many known time delay switches that are available, there is a need for a simple, low cost, time delay switch that allows the user to set a preselected but variable delay time. The switch should be easy to use when needed, and preferably be configured for direct replacement of conventional wall-mounted switches.

SUMMARY OF THE INVENTION

According to its major aspects and broadly stated, the present invention is a time delay switch for use with an electrical load and a supply line. The device includes a multiple-position toggle switch and a user-programmable microchip. The toggle is movable among three positions: an "OFF" position, an opposing "ON" position, and a "TIMER" position on the side of the OFF position away from the "ON" position. The toggle is biased by a spring away from the TIMER position to the OFF position so that, whenever it is moved to TIMER, it returns to the central OFF position.

When the toggle is moved to the TIMER position, an electrical signal is sent to the microchip that (1) starts a clock for a preselected and adjustable period of time and (2) establishes the flow of electricity through the switch as though the toggle was in the ON position during that time although the switch has been biased back into the OFF position where it remains. Thus, moving the toggle to TIMER "converts" the OFF position of the switch to a second, temporary ON position. Several repeated movements of the toggle to the TIMER position will multiply the clocked periods by the number of movements.

To energize an electrical load such as a light for, say, a two minute delay, the user would toggle from OFF to TIMER twice in succession, assuming that the clock interval was preselected for one minute intervals per movement of the toggle. The toggle returns to the OFF position each time it is moved to the TIMER position or "toggled," and current flows through the circuit for two successive one-minute clocked intervals before the current is shut off. To energize the load for any multiple "n" of the clock interval, the switch is toggled to TIMER "n" times in succession.

An important feature of the present invention is the use of a multiple-position switch having two stable positions (ON, OFF) and one unstable position (TIMER). The switch is preferably a toggle switch with the stable ON and unstable TIMER positions disposed on either side of the stable OFF position, and with the TIMER position biased towards OFF. The advantage of this configuration is that the user does not need to remember to return the switch to the OFF position each time the timer is used; the switch resets itself automatically to OFF. In addition, the device operates as a conventional ON-OFF switch whenever a time delay is not needed. If the ON position is uppermost, as in many conventional wall-mounted switches, the device "feels" like a conventional switch until toggled to the extreme, TIMER position.

Another important feature of the present invention is the ability to change the time delay interval. The duration of the fundamental clock interval can be adjusted by means of dip switches or the like, and this fundamental time delay can be multiplied simply by toggling to the TIMER position to program the microchip for as many clock intervals as are desired. For example, if the clock interval is one minute and a delay of five minutes is desired, the user simply toggles the switch from OFF to TIMER five times in succession. If five minute delays are the rule rather than the exception in a particular application, then the fundamental delay can be changed from one minute to five minutes.

In addition, the microchip can be programmed to either pass current for a preselected period when the switch is moved to the TIMER position, energizing a load for that period, or, alternatively, to start passing current after the period elapses. Thus, the device can be used to turn a light or other electrical load off after a user-determined period of time, or to turn the load on after a preselected time.

Still another feature of the invention is the feedback provided to the user. The switch has two stable positions (ON and OFF) and one unstable position (TIMER), so that the user receives tactile feedback when the switch is toggled from one position to another. If desired, an optical indicator such as a light-emitting diode (LED) can be mounted on the cover plate of the switch to indicate that the time delay function is activated, and a transducer that generates an audible or visible signal, or both, in response to movement of the switch to the TIMER position.

Other features and advantages of the present invention will be apparent to those skilled in the art from a careful reading of the Detailed Description of a Preferred Embodiment presented below and accompanied by the drawings.

BRIEF DESCRIPTION OF THE DRAWINGS

FIG. 1 is a perspective view of a time delay device according to a preferred embodiment of the present invention;

FIG. 2 is a side view of the device of FIG. 1;

FIG. 3 is a side cross-sectional view of the device;

FIG. 4 is a block diagram of the device connected to an electrical load and an AC supply line;

FIG. 5 is a block diagram of a circuit for use with the device; and

FIG. 6 is a flow chart showing the operation of the device.

DETAILED DESCRIPTION OF A PREFERRED EMBODIMENT

In the following description, similar components are referred to by the same reference numeral in order to simplify the understanding of the sequential aspect of the drawings.

Referring now to FIGS. 1–3, there is shown a time delay device 10 according to a preferred embodiment of the present invention. Device 10 includes a panel 12 carrying a three-position switch 14 mounted thereon. Switch 14 has a forwardly-projecting toggle 16 and a pair of contacts 18, 20 for connecting to a source of electrical power. Switch 14 preferably snaps into place against panel 12, held by a pair of flanges 22 or other conventional snap-in means. Alternatively, switch 14 may be attached to panel 12 by screws, rivets or the like.

A microprocessor circuit 30 is attached to a housing 24 of switch 14, connected to contacts 18, 20 by leads 32, 34, respectively. Alteratively, circuit 30 may be positioned inside housing 24, or disposed on a circuit board connected to contacts 18, 20. As seen in FIG. 3, switch 14 includes three contacts 44, 46, 48, a spring 50, and a leaf spring 51. Device 10 is preferably adapted to be mounted in a standard wall switch receptacle (not shown), covered by a face plate 40. Preferably, device 10 is configured so that, when positioned for use, toggle 16 moves in an approximately vertical direction. However, device 10 may be positioned so that toggle 16 moves horizontally or in some other direction. If desired, toggle 16 may be rotatable among the OFF, ON, and TIMER positions.

A block diagram showing device 10 connected to an electrical load 60 is shown in FIG. 4. A first electrical conductor 62 connects device 10 to load 60 via an electrical connector 64, which is preferably a bolt-secured connection of two wires, and a second electrical conductor 66 connects device 10 directly to a source of AC power (indicated by lines M—M) via a connector 68, also preferably a bolted attachment of two wires. Power to load 60 is controlled by moving toggle 16 among upper, center, and lower positions A, B, and C, respectively, so that a movable contact 52 contacts one of three stationary contacts 44, 46, 48 (FIGS. 3, 4), respectively. Preferably, upper position A (first stationary contact 44) is a stable position wherein switch 14 is in a "power-on" mode; center position B (second stationary contact 46) is a stable position corresponding to "power-off" (OFF); and lower position C (third stationary contact 48) is an unstable position for programming a delay time (TIMER), as will be described below. As shown in FIG. 1, the base of toggle 16 may carry suitably-positioned legends such as "ON", "OFF", and "TIMER" to alert the user that toggle 1.6 is in either of these positions. Alternatively, cover plate 40 may carry legends such as "ON", "OFF", and "TIMER", placed to one side of a cutout 42 configured to accept toggle 16. If desired, cover plate 40 may have raised, appropriately-positioned symbols that can be felt by a visually-impaired user.

When toggle 16 is in positions A or B, device 10 acts like a conventional single-pole/single-throw switch with two operative modes. When the user moves toggle 16 to position A (ON), contacts 44 and 52 are connected, switch 14 is in the power-on state and load 60 is connected to power lines M—M to establish a flow of electricity through the load. When toggle 16 is in position B (OFF), contact 52 is in electrical connection with contact 46 and switch 14 is in the conventional power-off state, breaking the flow of electricity between load 60 and power lines M—M (FIG. 4). The circuit to load 60 is open, and no energy is supplied to the load. Positions A and B are stable, thus, when toggle 16 is in either of these positions, it remains there until moved by the operator.

Position C (TIMER) is unstable. When the operator moves toggle 16 to position C, movable contact 52 presses spring-loaded contact 48, connecting contacts 48 and 52, and programming circuit 30 to allow current flow through load 60 for a preselected period of time. Springs 50, 51 exert a restoring force on toggle 16, returning the toggle to position B (OFF). Moving toggle 16 from position B to position C causes microprocessor circuit 30 to generate a first signal, starting a clock that generates a second signal after a preselected interval of time, breaking the flow of electricity to said load 60. Alternatively, microprocessor circuit 30 may be programmed to start passing current after the preselected period elapses.

As noted above, FIG. 1 shows stable ON and unstable TIMER positions disposed on either side of the stable OFF position, with the TIMER position biased towards OFF. However, other arrangements may also be convenient. By way of example, position C may correspond to a stable OFF position, center position B to a stable ON position, and position A to an unstable TIMER position. Preferably, device 10 is mounted for use with the ON position above OFF, so that the device feels like a conventional wall switch until toggled to TIMER.

A block diagram of a microprocessor circuit suitable for use with the invention is shown in FIG. 5. A circuit 70 may include a power triac 72 connected across electrical connectors 64 and 68, a programmable microchip 74, a power supply 76, a transducer 78, and a plurality of programmable switches 80. When switch 14 is in position C (TIMER), triac 72 serves as a controllable switch through which electric current from power lines M—M passes to load 60. Power supply 76 rectifies AC power from lines M—M and provides a suitable DC voltage for operating microchip 74. If desired, triac 72 may be replaced by some other type of device that uses a gate electrode to trigger conduction between two other electrodes, such as two silicon-controlled rectifiers (SCRs) or thyristors.

Transducer 78 provides audible or visible feedback, or both, to the operator. Transducer 78 may output a tone, beep, "chirp" or other audible signals each time toggle 16 is moved to position C (TIMER). Alternatively, transducer 78 may be an indicator light, such as a light-emitting diode (LED) or similar device that turns on momentarily whenever toggle 16 is moved to position C. If desired, circuit 70 may include an indicator light that is turned on while the circuit is operative, or tactile indicators such as a button that is raised during operation of the timer. Because of the capability for providing audible, visible and tactile feedback to the operator, device 10 may be advantageous for sight- or hearing-impaired users.

Programmable switches 80 (dip switches, adjustable slide contacts, or other suitable means for programming microchip 74) allow the user to adjust the clock time of microchip 74 in increments of 1 minute, 5 minutes, 10 minutes, 30 minutes, 1 hour, or any desired interval. While three dip switches are shown, it will be understood that some other number of switches may be provided. Switches 80 may be positioned on face plate 40 for easy access by the user, on panel 12, on housing 24, or some other suitable location in device 10.

Microchip 74 may be programmed to pass current through load 60 for a preselected period of time when toggle 16 is moved to the TIMER position, or, alternatively, to start passing current through the load after a preselected period. Programmable switches 80 may include a dip switch or the like that allows the user to select a state wherein a light or other electrical load is turned off after a preselected time interval, or a state wherein the load is turned on after a preselected time, which is an equivalent embodiment of the preferred embodiment described herein.

A flow chart that partially illustrates the operation of device 10 is shown in FIG. 6. When toggle 16 is moved to the TIMER position, an electrical signal is sent to microchip 74 that (1) starts a clock for a preselected period of time and (2) permits electricity to flow through switch 14 as though the toggle was in the ON position during that time. In operation, the operator adjusts the delay time of device 10 simply by toggling switch 14 to position C (TIMER) as many times as needed to program microchip 74 for the desired delay. For example, if programming switches 80 are set to provide a one-minute fundamental clock interval and a delay of five minutes is desired, the user moves toggle 16 to position C five times in succession to multiply the clock interval. If a different fundamental interval is desired, switches 80 may be used to adjust the interval in increments of seconds, minutes, and so forth. Preferably, microchip 74 is programmed so that the operator can initialize circuit 70 by moving toggle 16 to position A (ON), then to position B (OFF). Because toggle 16 is biased towards OFF, the user does not need to return toggle 16 to OFF each time the timer function is used; the toggle returns automatically to OFF. When the timer is not used, switch 16 is used as a conventional ON-OFF switch.

Once toggle 16 has been moved to the TIMER position several times, the user may lose count of the number of times the toggle has been moved, or may decide not to use the timer. In either case, circuit 70 can be re-initialized by moving toggle 16 to ON. Once initialized, the user may leave toggle 16 at ON, move the toggle to OFF, or re-program microchip 74 by moving the toggle to TIMER.

As noted above, device 10 may be configured to match with existing toggle-accepting slotted front cover plates such as are used with conventional wall switch box assemblies, so that no modification of an existing wall plate is necessary. Toggle 16 can be configured to fit through the slot of a cover plate to be actuated in a vertical or horizontal direction as desired, but having three positions as contrasted with the normal two-position switch assemblies.

It will be apparent to those skilled in the art that many changes and substitutions can be made to the preferred embodiment herein described without departing from the spirit and scope of the present invention as defined by the appended claims.

What is claimed is:

1. A switch for use in controlling a flow of electricity to an electrical load from a source of electrical power, said switch comprising:

a housing;

a toggle carried by said housing and having
a first position wherein said toggle establishes a flow of electricity between said source of electrical power and said electrical load when said toggle is moved to said first position,
a second position wherein said toggle breaks said flow of electricity between said source of electrical power and said electrical load when said toggle is moved from said first position to said second position, and
a third position;

clock means in said housing; and electrical circuit means in said housing for causing electricity to flow from said source of said electrical power to said electrical load when said toggle is moved to said third position, said electrical circuit means generating a first signal when said toggle is moved to said third position from said second position, said clock means being responsive to said first signal and generating a second signal after a preselected interval of time, said electrical circuit means responsive to said second signal and breaking said flow of electricity to said electrical load from said source of electricity when said second signal is received from said clock means.

2. The switch as recited in claim 1, further comprising means for biasing said toggle from said third position to said second position.

3. The switch as recited in claim 1, wherein movement of said toggle to said third position sends said first signal to said clock means each time said toggle is moved, and said clock means further comprises means for multiplying said intervals of time by as many times as said toggle is moved to said third position.

4. The switch as recited in claim 1, wherein said electrical circuitry further comprises means for adjusting the duration of said interval of time.

5. The switch as recited in claim 1, further comprising means responsive to said first signal for generating an audible signal in response to movement of said switch to said third position.

6. The switch as recited in claim 1, further comprising means responsive to said first signal for generating a visible signal in response to movement of said switch to said third position.

7. A switch for use in connecting an electrical load to a source of electrical power, said switch comprising:

a housing;

a toggle carried by said housing and having
an on position wherein said toggle establishing a flow of electricity between said source of electrical power and said electrical load when said toggle is moved to said on position,
an off position wherein said toggle breaks said flow of electricity between said source of electrical power and said electrical load when said toggle is moved from said on position to said off position, and a timer position;

spring means for biasing said toggle from said timer position to said off position;

clock means in said housing; and electrical circuit means in said housing for causing electricity to flow from said source of said electrical power to said electrical load when said toggle is moved to said timer position, said electrical circuit means generating a first signal when said toggle is moved to said timer position from said off position, said clock means being responsive to said first signal and generating a second signal after a preselected interval of time, said electrical circuit means responsive to said second signal and breaking said flow of electricity to said electrical load from said source of electricity when said second signal is received from said clock means.

8. The switch as recited in claim 7, wherein said spring means further comprises a leaf spring.

9. The switch as recited in claim 7, wherein movement of said toggle to said timer position sends said first signal to said clock means each time said toggle is moved, and said clock means further comprises means for multiplying said intervals of time by as many times as said toggle is moved to said timer position.

10. The switch as recited in claim 7, wherein said electrical circuitry further comprises means for adjusting the duration of said interval of time.

11. The switch as recited in claim 7, wherein said electrical circuitry further comprises a plurality of switches for adjusting the duration of said interval of time, each switch of said plurality of switches having at least two positions, said positions of said plurality of switches determining said interval of time.

12. The switch as recited in claim 7, further comprising means responsive to said first signal for generating an audible signal in response to movement of said switch to said timer position.

13. The switch as recited in claim 7, further comprising means responsive to said first signal for generating a visible signal in response to movement of said switch to said timer position.

14. A switch for use in connecting an electrical load to a source of electrical power, said switch comprising:

a housing;

a toggle carried by said housing and having an on position wherein said toggle establishing a flow of electricity between said source of electrical power and said electrical load when said toggle is moved to said on position, an off position wherein said toggle breaks said flow of electricity between said source of electrical power and said electrical load when said toggle is moved from said on position to said off position, and a timer position;

spring means for biasing said toggle from said timer position to said on position;

clock means in said housing; and electrical circuit means in said housing for breaking the flow of electricity from said source of said electrical power to said electrical load when said toggle is moved to said timer position, said electrical circuit means generating a first signal when said toggle is moved to said timer position from said on position, said clock means being responsive to said first signal and generating a second signal after a preselected interval of time, said electrical circuit means responsive to said second signal and causing electricity to flow to said electrical load from said source of electricity when said second signal is received from said clock means.

15. The switch as recited in claim 14, wherein said spring means further comprises a leaf spring.

16. The switch as recited in claim 14, wherein movement of said toggle to said timer position sends said first signal to said clock means each time said toggle is moved, and said clock means further comprises means for multiplying said intervals of time by as many times as said toggle is moved to said timer position.

17. The switch as recited in claim 14, wherein said electrical circuitry further comprises means for adjusting the duration of said interval of time.

18. The switch as recited in claim 14, wherein said electrical circuitry further comprises a plurality of switches for adjusting the duration of said interval of time, each switch of said plurality of switches having at least two positions, said positions of said plurality of switches determining said interval of time.

19. The switch as recited in claim 14, further comprising means responsive to said first signal for generating an audible signal in response to movement of said switch to said timer position.

20. The switch as recited in claim 14, further comprising means responsive to said first signal for generating a visible signal in response to movement of said switch to said timer position.

* * * * *